(12) United States Patent
Arnitz et al.

(10) Patent No.: US 10,686,236 B2
(45) Date of Patent: Jun. 16, 2020

(54) SYSTEMS AND METHODS FOR PHASE SHIFTING SIGNALS

(71) Applicant: Searete LLC, Bellevue, WA (US)

(72) Inventors: Daniel Arnitz, Seattle, WA (US); Joseph Hagerty, Seattle, WA (US); Russell J. Hannigan, Sammamish, WA (US); Guy S. Lipworth, Seattle, WA (US); Matthew S. Reynolds, Seattle, WA (US); Yaroslav A. Urhumov, Bellevue, WA (US)

(73) Assignee: The Invention Science Fund I, LLC, Bellevue, WA (US)

( * ) Notice: Subject to any disclaimer, the term of this patent is extended or adjusted under 35 U.S.C. 154(b) by 217 days.

(21) Appl. No.: 15/839,125

(22) Filed: Dec. 12, 2017

(65) Prior Publication Data

US 2019/0181523 A1    Jun. 13, 2019

(51) Int. Cl.
| | | |
|---|---|---|
| *H01P 1/18* | (2006.01) | |
| *H01P 5/22* | (2006.01) | |
| *H01P 1/185* | (2006.01) | |
| *H03H 7/20* | (2006.01) | |
| *H02J 50/20* | (2016.01) | |
| *H03H 7/18* | (2006.01) | |
| *H03H 7/48* | (2006.01) | |
| *H01P 5/16* | (2006.01) | |

(52) U.S. Cl.
CPC .............. *H01P 1/184* (2013.01); *H01P 1/185* (2013.01); *H01P 5/227* (2013.01); *H02J 50/20* (2016.02); *H03H 7/185* (2013.01); *H03H 7/20* (2013.01); *H01P 5/16* (2013.01); *H03F 2200/198* (2013.01); *H03H 7/482* (2013.01)

(58) Field of Classification Search
CPC .......... H01P 1/184; H01P 1/185; H02J 50/20; H03H 7/20; H03H 2200/198; H03H 7/482; H03H 7/185
USPC ...................... 333/24 R, 139, 156, 161, 117
See application file for complete search history.

(56) References Cited

U.S. PATENT DOCUMENTS

| | | |
|---|---|---|
| 6,643,137 B1 | 11/2003 | Chung et al. |
| 9,912,199 B2 | 3/2018 | Leabman et al. |
| 10,230,266 B1 | 3/2019 | Leabman et al. |
| 2003/0184969 A1 | 10/2003 | Itabashi et al. |

(Continued)

OTHER PUBLICATIONS

Joseph F. White, Member, IEEE, (Invited Paper), Diode Phase Shifters for Array Antennas, IEEE Transactions on Microwave Theory and Techniques, vol. MTT-22, No. 6, Jun. 1974, pp. 658-674.

(Continued)

*Primary Examiner* — Rakesh B Patel
*Assistant Examiner* — Jorge L Salazar, Jr.

(57) ABSTRACT

According to various embodiments, a quadrature hybrid coupler included as part of a phase shifter is used to provide variable phase shift to an input signal. The quadrature hybrid coupler includes an input port, an output port, and two terminated ports. The phase shifter includes one or more static lumped elements connected to the QHC to reduce at least one electrical dimension of the QHC to substantially less than a quarter wavelength. The phase shifter also include one or more variable lumped elements connected to the QHC to provide a variable phase shift to the input signal between the input port and the output port of the QHC.

43 Claims, 9 Drawing Sheets

(56) References Cited

U.S. PATENT DOCUMENTS

| | | | |
|---|---|---|---|
| 2004/0189473 A1 | 9/2004 | Mickle et al. | |
| 2006/0232359 A1* | 10/2006 | Fukuda | H01P 5/227 333/117 |
| 2010/0069011 A1* | 3/2010 | Carrick | G06K 7/0008 455/63.1 |
| 2011/0199920 A1 | 8/2011 | Takei et al. | |
| 2012/0188723 A1 | 7/2012 | Liu et al. | |
| 2012/0217926 A1 | 8/2012 | Yoon et al. | |
| 2013/0003306 A1 | 1/2013 | Oota et al. | |
| 2013/0207274 A1 | 8/2013 | Liu et al. | |
| 2014/0009889 A1 | 1/2014 | Lee et al. | |
| 2015/0236395 A1* | 8/2015 | Analui | H03H 7/46 333/117 |
| 2015/0270821 A1* | 9/2015 | Natarajan | H03H 7/20 455/78 |
| 2017/0179766 A1 | 6/2017 | Zeine et al. | |
| 2018/0166924 A1 | 6/2018 | Hosseini et al. | |

OTHER PUBLICATIONS

David M. Pozar, Microwave Engineering, 4th Ed, Wiley, John Wiley & Sons, Inc., Nov. 2011, © 2012, 756 pp. 756.

M. Schuhler, C. Schmidt, J. Wansch, and M.A. Hein, Phase Shifters based on Pin-Diodes and Varactors: Two Concepts by Comparison, IWK, International Wissenschaftliches Kolloquium, International Scientific Colloquium, Proceedings, Facity of Electrical Engineering and Information Science, Information Technology and Electrical Engineering —Devices and Systems, Materials and Technologies for the Future, Sep. 11-15, 2006, 18 pages.

Skyworks, Application Note, A Varactor Controlled Phase Shifter for PCS Base Station Applications, Aug. 13, 2009, pp. 1-9.

\* cited by examiner

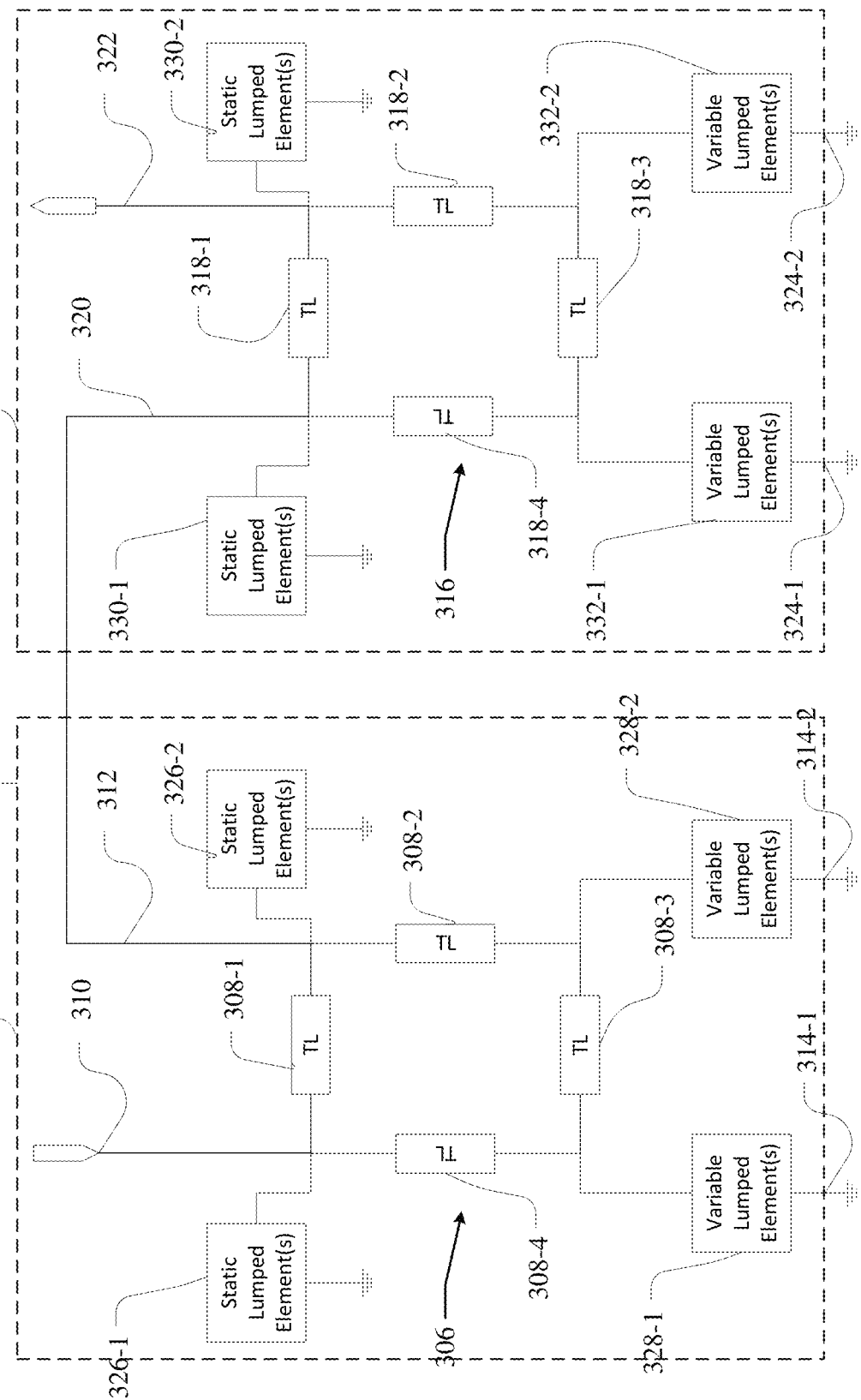

SYSTEMS AND METHODS FOR PHASE SHIFTING SIGNALS

If an Application Data Sheet (ADS) has been filed on the filing date of this application, it is incorporated by reference herein. Any applications claimed on the ADS for priority under 35 U.S.C. §§ 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 USC § 119(e) for provisional patent applications, for any and all parent, grandparent, great-grandparent, etc. applications of the Priority Application(s)).

PRIORITY APPLICATIONS

If the listings of applications provided above are inconsistent with the listings provided via an ADS, it is the intent of the Applicant to claim priority to each application that appears in the Domestic Benefit/National Stage Information section of the ADS and to each application that appears in the Priority Applications section of this application. All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

TECHNICAL FIELD

This disclosure relates to phase shifting of input signals. Specifically, this disclosure relates to variably shifting phase of input signals using one or more quadrature hybrid couplers (herein referred to as "QHCs") and one or more variable lumped elements connected to the one or more QHCs.

SUMMARY

According to various embodiments, a phase shifter includes a QHC. The QHC includes an input port, an output port and two terminated ports. The phase shifter also includes one or more static lumped elements connected to the QHC and configured to reduce at least one electrical dimension of the QHC to substantially less than a quarter wavelength. Additionally, the phase shifter also includes one or more variable lumped elements connected to the QHC and configured to provide a variable phase shift between the input port and the output port of the QHC.

In various embodiments, a signal is received at an input port of a QHC included as part of a phase shifter. In addition to the input port, the QHC includes an output port and two terminated ports. The phase shifter includes one or more static lumped elements connected to the QHC and configured to reduce at least one electrical dimension of the QHC to substantially less than a quarter wavelength. The phase shifter also includes one or more variable lumped elements connected to the QHC and configured to provide a variable phase shift to signals including the received signal between the input port and the output port of the QHC. The variable phase between the input port and the output port can be adjusted using the one or more variable lumped elements as part of controlling the phase shifter.

In certain embodiments, an array of phase shifters comprises a plurality of QHCs that each include an input port, an output port, and two terminated ports. The array of phase shifters also include one or more static lumped elements connected to the QHCs and configured to reduce at least one electrical dimension of the QHCs to substantially less than a quarter wavelength. Further, the array of phase shifters include one or more variable lumped elements connected to the QHCs and configured to provide variable phase shifts between the input ports and the output ports. The system also includes a controller for controlling the array of phase shifters by controlling the variable phase shifts of the array of phase shifters.

In various embodiments, an array of QHCs are printed onto a printed circuit board. Each QHC includes an input port, an output port, and two terminated ports. One or more static lumped elements are coupled to the printed circuit board and connected to the array of QHCs to reduce at least one electrical dimension of the QHCs to substantially less than a quarter wavelength. Further, one or more variable lumped elements are coupled to the printed circuit board and connected to the array of QHCs to provide variable phase shifts between the input ports and the output ports of the QHCs. In combination, the array of QHCs along with the one or more static lumped elements and the one or more variable lumped elements form an array of phase shifters.

BRIEF DESCRIPTION OF THE DRAWINGS

FIG. 3 illustrates a circuit diagram of an example multi-stage phase shifter.

DETAILED DESCRIPTION

Figure 1:
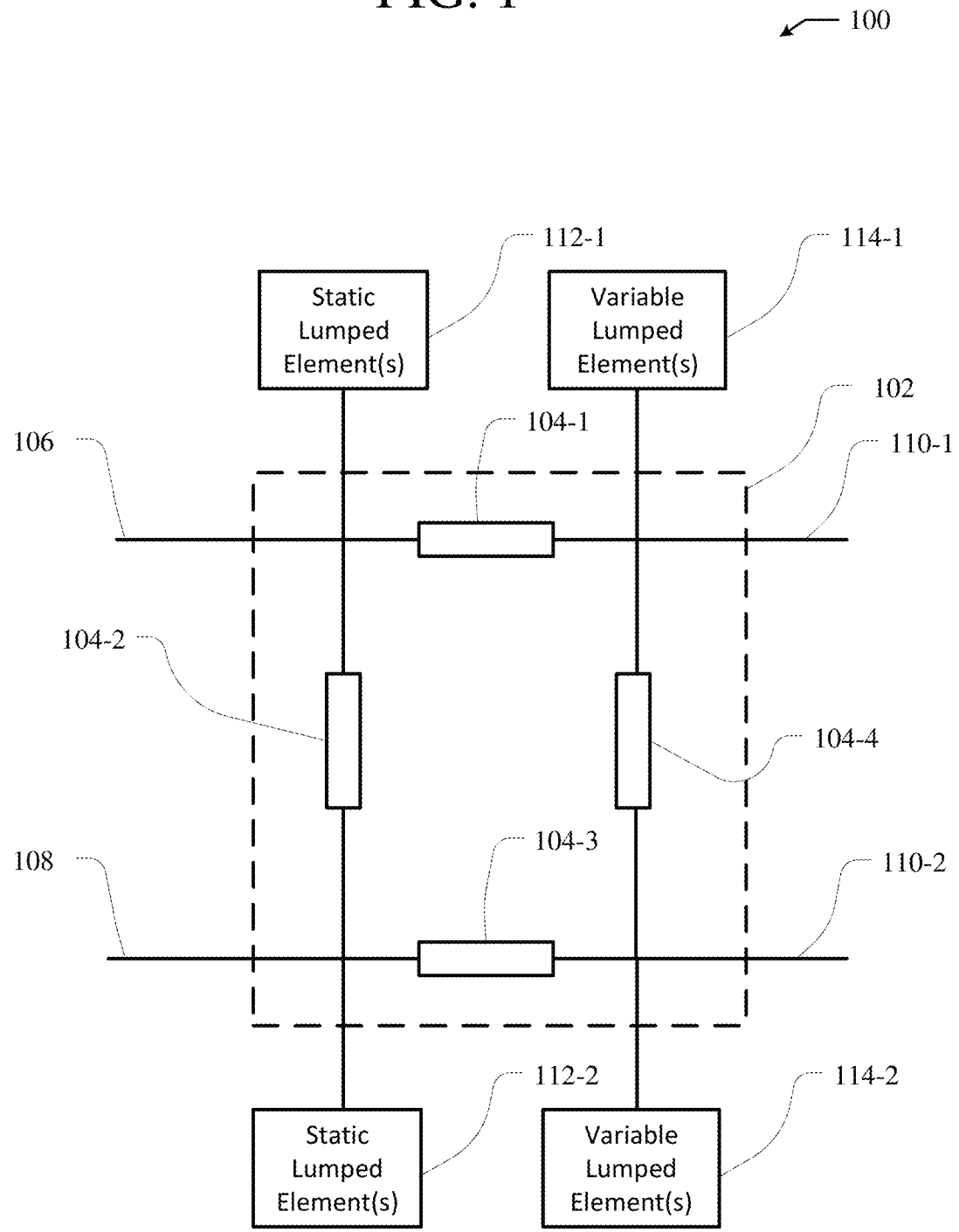
FIG. 1 illustrates a circuit diagram of an example phase shifter.

In various embodiments, a phase shifter includes a quadrature hybrid coupler comprising four transmission lines. The QHC can include an input port, an output port, and two terminated ports. The input port can receive an input signal to be phase shifted by the phase shifter using the QHC. The phase shifter can include one or more static lumped elements connected to the QHC and configured to reduce at least one electrical dimension of the QHC to substantially less than a quarter wavelength. Additionally, the one or more static lumped elements can reduce physical dimensions of the QHC. Subsequently, the QHC can be printed onto a printed circuit board based on the one or more static lumped elements. The phase shifter can include one or more variable lumped elements connected to the QHC. The one or more variable lumped elements can be configured to provide a variable phase shift between the input port and the output port. More specifically, the one or more variable lumped elements can be can be configured to provide a specific phase shift of a variable phase shift to the input signal received at the input port.

In certain embodiments, a signal is received at an input port of a quadrature hybrid coupled included as part of a phase shifter. The QHC can include an output port, and two terminated ports in addition to the input port. The phase shifter can include one or more static lumped elements connected to the QHC and configured to reduce at least one electrical dimension of the QHC to substantially less than a quarter wavelength. Additionally, the one or more static lumped elements can reduce physical dimensions of the QHC. Subsequently, the QHC can be printed onto a printed circuit board in response to the one or more static lumped elements. The phase shifter can include one or more variable lumped elements connected to the QHC. The one or more variable lumped elements can be used to adjust a variable phase shift of the phase shifter between the input port and the output port as part of controlling the phase shifter.

In various embodiments, an array of phase shifters includes a plurality of quadrature hybrid couplers. Each of the QHCs can include an input port, an output port, and two terminated ports. The phase shifters can include one or more static lumped elements connected to the QHCs to reduce at least one electrical dimension of the QHCs to substantially less than a quarter wavelength. The phase shifters can also include one or more variable lumped elements connected to the QHCs configured to provide variable phase between the input ports and the output ports. The system can also include a controller for controlling the array of phase shifters by controlling the variable phase shifts applied by the array of phase shifters.

In certain embodiments, an array of quadrature hybrid couplers is printed onto a printed circuit board. Each QHC can include an input port, an output port, and two terminated ports. One or more static lumped elements can be coupled to the printed circuit board to connect the one or more static lumped elements to the array of QHCs. The one or more static lumped elements can reduce at least one electrical dimension of the QHCs to substantially less than a quarter wavelength. One or more variable lumped elements can also be coupled to the printed circuit board to connect the one or more variable lumped elements to the array of QHCs. The one or more variable lumped elements can be configured to provide variable phase shift between the input ports and the output ports of the QHCs in the array of QHCs. The array of QHCs along with the one or more static lumped elements and the one or more variable lumped elements can form an array of phase shifters.

Some of the infrastructure that can be used with embodiments disclosed herein is already available, such as general-purpose computers, RF antennas, computer programming tools and techniques, digital storage media, and communications networks. A computing device may include a processor such as a microprocessor, microcontroller, logic circuitry, or the like. The processor may include a special purpose processing device such as an ASIC, PAL, PLA, PLD, FPGA, or other customized or programmable device. The computing device may also include a computer-readable storage device such as non-volatile memory, static RAM, dynamic RAM, ROM, CD-ROM, disk, tape, magnetic, optical, flash memory, or other computer-readable storage medium.

Various aspects of certain embodiments may be implemented using hardware, software, firmware, or a combination thereof. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc., that performs one or more tasks or implements particular abstract data types.

In certain embodiments, a particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network.

The embodiments of the disclosure will be best understood by reference to the drawings, wherein like parts are designated by like numerals throughout. The components of the disclosed embodiments, as generally described and illustrated in the figures herein, could be arranged and designed in a wide variety of different configurations. Furthermore, the features, structures, and operations associated with one embodiment may be applicable to or combined with the features, structures, or operations described in conjunction with another embodiment. In other instances, well-known structures, materials, or operations are not shown or described in detail to avoid obscuring aspects of this disclosure.

Thus, the following detailed description of the embodiments of the systems and methods of the disclosure is not intended to limit the scope of the disclosure, as claimed, but is merely representative of possible embodiments. In addition, the steps of a method do not necessarily need to be executed in any specific order, or even sequentially, nor need the steps be executed only once.

FIG. 1 illustrates a circuit diagram of an example phase shifter 100. The example phase shifter 100 shown in FIG. 1 includes a QHC 102. The QHC 102 can be of an applicable size and comprise applicable components. More specifically, the QHC includes a first transmission line 104-1, a second transmission line 104-2, a third transmission line 104-3, and a fourth transmission line 104-4 (herein referred to as "transmission lines 104"). The transmission lines 104 can be fabricated from an applicable electrically conductive material for transmitting an electrical signal.

The QHC 102 includes an input port 106 and an output port 108. Additionally, the QHC 102 includes a first terminated port 110-1 and a second terminated port 110-2 (herein referred to as "terminated ports 110"). The QHC 102 can receive an input signal on the input port 106. Additionally, the QHC 102 can provide an output signal, e.g. a modified or phase shifted input signal, on the output port 108.

In certain embodiments, the QHC 102 can receive an input signal within a specific frequency range on the input port 106 and the phase shifter 100 can subsequently shift a phase of at least a portion of the input signal. More specifically, the QHC 102 can receive an RF signal on the input port 106 and the phase shifter 100 can subsequently shift a phase of at least a portion of the RF signal. For example, the QHC 102 can receive an input signal with a frequency in the range of 5.8 to 5.9 GHz. Further in the example, the phase shifter 100 can shift a phase of at least a portion of the input signal in the 5.8 to 5.9 GHz frequency range.

The example phase shifter 100 shown in FIG. 1 includes first static lumped elements 112-1 and second static lumped elements 112-2 (herein referred to as "static lumped elements 112). Static lumped elements, as used herein, can include an applicable static circuit element, otherwise a circuit element with an unchanging circuit property. Specifically, the static lumped elements 112 can include one or more static capacitors, one or more inductors, or a combination of static capacitors and static inductors. While the static lumped elements 112 are referred to as a plurality of elements, in certain embodiments the static lumped elements 112 can include only a single element. For example, the first static lumped elements 112-1 can include a single shunt capacitor.

The static lumped elements 112 can facilitate or otherwise allow for decreased physical sizes of the QHC 102, e.g. miniaturization of the QHC 102. Specifically, the QHC 102 can have a footprint less than or equal to $\frac{1}{10}$ of an operating wavelength by $\frac{1}{10}$ of the operating wavelength of an operating frequency of the QHC 102. For example, the QHC 102 can have a footprint less than or equal to 3 mm by 3 mm. An operating frequency of the of the QHC 102 can be in a frequency band within a frequency range of greater than 0 GHz and less than or equal to 24.5 GHz. More specifically, an operating frequency of the QHC 102 can be in the 5.8-5.9 GHz frequency band and/or the 24-24.5 GHz frequency band.

Further, the static lumped elements 112 can reduce at least one electrical dimension of the QHC 102 to less than or equal to a quarter of a wavelength, $\lambda/4$. For example, as a result of including the static lumped elements 112, either or both the second transmission line 104-2 and the fourth transmission line 104-4 of the QHC 102 can have electrical lengths of one eighth of a wavelength, $\lambda/8$, of an operating frequency of the QHC 102. Further in the example, as a result of including the static lumped elements 112, either or both the first transmission line 104-1 and the third transmission line 104-3 of the QHC 102 can have electrical lengths of one twelfth of a wavelength, $\lambda/12$.

In various embodiments, by reducing either or both a physical size and electrical dimensions, e.g. electrical lengths, of the QHC 102, the static lumped elements 112 can increase an amount of phase shift the phase shifter 100 can apply to signals. More specifically, reducing either or both a physical size and electrical dimensions of the QHC 102 can increase an amount of phase shift applied by the phase shifter 100 as compared to a phase shifter implemented using a QHC without the static lumped elements 112. For example, the phase shifter 100 can shift a phase of a received signal by an amount greater than 90°, e.g. an amount between 90° and 180°. By increasing an amount of phase shift by reducing either or both a physical size and electrical dimensions of the QHC 102, fewer QHCs need to be included in a phase shifter in order to achieve 360° or greater of phase shift. For example, a phase shifter can be created to shift a phase of a signal by at least 360° using two QHCs with static lumped elements.

The example phase shifter 100 shown in FIG. 1 includes first variable lumped elements 114-1 and second variable lumped elements 114-2 (herein referred to as "variable lumped elements 114"). Variable lumped elements, as used herein, can include one or a combination of applicable variable reactance devices or materials. For example, the variable lumped elements 114 can include one or a combination of a varactor diode, a transistor, and a non-linear substrate. Variable lumped elements can be responsive to control inputs. For example, a reactance of a variable lumped element can vary based on one or more bias voltages applied to the variable lumped elements. The variable lumped elements 114 can include static circuit elements. For example, the variable lumped elements 114 can include one or more static capacitors.

The variable lumped elements 114 function to cause or otherwise allow the phase shifter 100 to apply a variable phase shift to signals. For example, the variable lumped elements 114 can be configured to cause the phase shifter 100 to apply 120° of phase shift to a first portion of a signal and 150° to a second portion of the signal. The phase shifter 100, using the variable lumped elements 114, can apply a variable phase shift across a range of phase shifts, otherwise referred to as a tuning range of the variable phase. For example, the phase shifter 100 can have a tuning range between 90° to 180° and subsequently shift phases of signals by amounts within the range of 90° to 180°.

While shown to be separate in the example circuit diagram shown in FIG. 1, the variable lumped elements 114 can be located at the corresponding terminated ports 110. Additionally, in being located at the terminated ports 110, the variable lumped elements 114 can function to terminate the ports 110. For example, the first variable lumped elements 114-1 can be located at the first terminated port 110-1 and function to terminate the port 110-1, while the second variable lumped elements 114-2 can be located at the second terminated port 110-2 and function to terminate the port 110-2.

In increasing a phase shift capable of being applied by the phase shifter 100 using the static lumped elements to reduce a physical size and electrical dimensions of the QHC 102, a tuning range of the phase shifter 100 in applying variable phase shifts can be increased. More specifically, a tuning range of the phase shifter 100 can be increased over a phase shifter implemented using a QHC without the static lumped elements 112. For example, the phase shifter 100 can be configured, using the static lumped elements 112, to shift phase of a signal within a tuning range of 0° to 180° as opposed to a phase shifter 100 that does not include the static lumped elements 112 and is only configured to shift phase of a signal within a tuning range of 0° to 90°.

The variable lumped elements 114 can be controlled to adjust a phase shift of a variable phase shift applied by the phase shifter 100. More specifically, bias voltages applied to the variable lumped elements 114 can be adjusted to create a variable phase shift of the phase shifter 100. For example, first one or more specific bias voltages can be applied to the variable lumped elements 114 to cause the phase shifter 100 to shift a phase of a signal by 70°. Further in the example, second specific bias voltages can be applied to the variable lumped elements 114 to cause the phase shifter 100 to shift a phase of additional portions of the signal by 170°.

Bias voltages applied to the variable lumped elements 114 can change a circuit property or reactance of the variable lumped elements to change a phase shift amount applied by the phase shifter 100. For example, bias voltages applied to the variable lumped elements 114 can change a capacitance of the variable lumped elements 114 to cause a changing phase shift in the phase shifter 100. In another example, bias voltages applied to the variable lumped elements 114 can change an amount of current that passes through the variable lumped elements 114 to cause a changing phase shift in the phase shifter 100.

Bias voltages applied to the variable lumped elements 114 to achieve a specific phase shift by the phase shifter 100 can be dependent on characteristics of the variable lumped elements 114. More specifically, bias voltages applied to the variable lumped elements 114 can depend on reactance characteristics of the variable lumped elements. For example, bias voltages applied to the variable lumped elements 114 can depend on capacitive characteristics of the variable lumped elements 114 to cause a specific phase shift or a variable phase shift in the phase shifter 100 using the variable lumped elements 114.

The phase shifter 100 can control a variable phase shift applied to all or portions of a received input signal based on a control signal received from an applicable controller, such as the variable phase shift controllers described herein. More specifically, the phase shifter 100 can control bias voltages applied to the variable lumped elements 114 according to a control signal in order to apply a desired phase shift of a variable phase shift to a received input signal. For example, if the variable lumped elements 114 are biased to cause the phase shifter to apply a 70° phase shift and a 110° phase shift is desired, then a control signal can be applied to modify bias voltages applied to the variable lumped elements 114 to cause the phase shifter 100 to apply a 110° phase shift to signals.

The phase shifter 100 can control a variable phase shift applied to a received input signal based on a received analog control signal. Additionally, the phase shifter 100 can control a variable phase shift applied to a received input signal based on a received analog control signal generated from a digital control signal, e.g. by a variable phase shift controller. In using an analog control signal to control the phase shifter 100, control systems can be implemented at a cheaper cost than control systems that digitally control phase shifters.

In an example of operation of the example phase shifter 100 shown in FIG. 1, the QHC 102 can receive an input signal at the input port 106. The variable lumped elements 114 can subsequently be controlled to adjust a phase of the input signal or different portions of the input signal to create a phase shifted signal. Finally, the phase shifted signal can be output through the output port 108 of the QHC 102.

Figure 2:
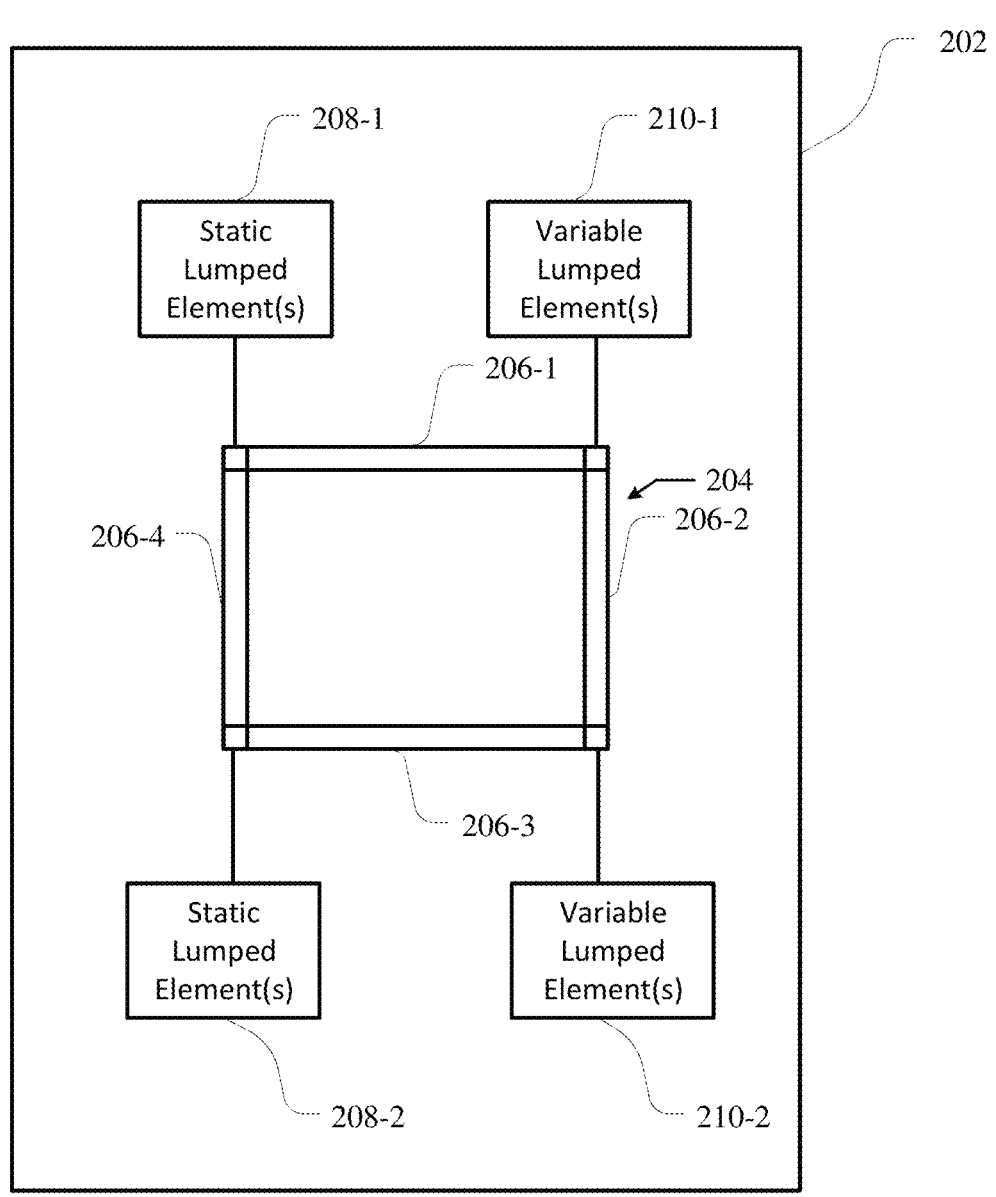
FIG. 2 illustrates a phase shifter implemented on a printed circuit board.

FIG. 2 illustrates a phase shifter 200 implemented on a printed circuit board 202. While only a single phase shifter 200 is shown implemented on the printed circuit board 202, the printed circuit board 202 can have a plurality of phase shifters implemented on it, e.g. in an array of phase shifters. The printed circuit board 202 can be single sided, e.g. include one conductive layer, double sided, e.g. include two conductive layers, or multi-layered, e.g. include multiple conductive layers. For example, the printed circuit board 202 can include multiple conductors on different layers that are laminated together. Conductive layers forming the printed circuit board 202 can be electrically coupled together through vertical interconnect accesses. In various embodiments, when the printed circuit board 202 includes a plurality of phase shifters, the phase shifters can be coupled to each other through the printed circuit board 202, e.g. through interconnects.

The phase shifter 200 includes QHC 204 implemented within the printed circuit board 202. The QHC 204 includes a first transmission line 206-1, a second transmission line 206-2, a third transmission line 206-3, and a fourth transmission line 206-4 (herein referred to as "transmission lines 206"). The transmission lines 206 can be implemented as microstrips of electrically conductive material or materials printed onto the circuit board 202. The transmission lines 206 can be printed on the printed circuit board 202 using an applicable printed circuit board manufacturing mechanism, e.g. using photoresist. In various embodiments, a plurality of transmission lines, including the transmission lines 206, can be printed on the printed circuit board 202, e.g. as microstrips to create a plurality of phase shifters as part of an array of phase shifters.

The phase shifter 200 includes first static lumped elements 208-1 and second static lumped elements 208-2 (herein referred to as "static lumped elements 208"). While the static lumped elements 208 are shown to include a plurality of elements, in various embodiments the static lumped elements 208 can only include a single circuit element. For example, the second static lumped elements 208-2 can include a single shunt capacitor. In various embodiments, the static lumped elements 208 can be printed onto the circuit board 202. For example, the static lumped elements 208 can include capacitors that are printed onto the circuit board 202 using an applicable printed circuit board manufacturing mechanism. Additionally, in various embodiments, the static lumped elements 208 can be mounted onto the printed circuit board 202. For example, the static lumped elements 208 can be soldered onto the printed circuit board 202 after the printed circuit board 202 is formed. Further in the example, the static lumped elements 208 can be soldered onto the printed circuit board 202 after the circuit board 202 is formed by printing the transmission lines 206 onto the board 202 as microstrips.

The static lumped elements 208 can reduce a physical size of the QHC 204. Additionally, the static lumped elements 208 can reduce one or more electrical dimensions of the QHC 204. For example, the static lumped elements 208 can reduce an electrical length of at least one of the transmission lines 206 to less than or equal to a quarter of a wavelength, $\lambda/4$.

The phase shifter 200 also includes first variable lumped elements 210-1 and second variable lumped elements 210-2 (herein referred to as "variable lumped elements 210"). While the variable lumped elements 210 are shown to include a plurality of elements, in various embodiments the variable lumped elements 210 can only include a single circuit component. For example, the variable lumped elements 210 can include a single varactor diode. In various embodiments, the variable lumped elements 210 can be printed onto the circuit board 202. For example, the variable lumped elements 210 can include capacitors and diodes that are printed onto the circuit board 202 using an applicable printed circuit board manufacturing mechanism. Additionally, in various embodiments, the variable lumped elements 210 can be mounted onto the printed circuit board 202. For example, the variable lumped elements 210 can be soldered onto the printed circuit board 202 after the printed circuit board 202 is formed. Further in the example, the variable lumped elements 210 can be soldered onto the printed circuit board 202 after the circuit board 202 is formed by printing the transmission lines 206 onto the board 202 as microstrips.

The variable lumped elements 210 can be used to control a variable phase shift applied to input signals by the phase shifter 200. More specifically, bias voltages can be applied to the variable lumped elements 210 to cause the phase shifter 200 to apply a specific phase shift amount of a variable phase shift amount. For example, the variable lumped elements 210 can include a varactor diode coupled in series with a capacitor. Further in the example, bias voltages applied to either or both the varactor diode and the capacitor can be modified to cause the phase shifter 200 to apply a specific phase shift amount of a variable phase shift amount.

FIG. 3 illustrates a circuit diagram of an example multi-stage phase shifter 300. The multi-stage phase shifter 300 includes a first phase shifter 302 and a second phase shifter 304. The first phase shifter 302 and the second phase shifter 304 are coupled together and can work in combination to provide variable phase shift to an input signal. More specifically, the first phase shifter 302 and the second phase shifter 304 are coupled together and can provide a variable phase shift across a tuning range of greater than or equal to 360°. For example, both the first phase shifter 302 and the second phase shifter 304 can provide a variable phase shift across a tuning range of 0° to 180°. Further in the example, in each providing up to 180° of variable phase shift, the first phase shifter 302 and the second phase shifter 304 can combine to provide up to 360° of variable phase shift.

The first phase shifter 302 includes a QHC 306. The QHC 306 includes a first transmission line 308-1, a second transmission line 308-2, a third transmission line 308-3, and a fourth transmission line 308-4 (herein referred to as "transmission lines 308"). In various embodiments, the transmission lines 308 can be printed onto a circuit board as microstrips. Additionally, the QHC 306 of the first phase shifter 302 includes an input port 310, and output port 312, and first and second terminated ports 314-1 and 314-2.

The second phase shifter 304 includes a QHC 316. The QHC 316 includes a first transmission line 318-1, a second transmission line 318-2, a third transmission line 318-3, and a fourth transmission line 318-4 (herein referred to as "transmission lines 318"). In various embodiments, the transmission lines 318 can be printed onto a circuit board as microstrips. More specifically, the transmission lines 318 can be printed along with the transmission lines 308 to form an array of QHCs including the corresponding QHC 306 and QHC 316. Additionally, the QHC 316 of the second phase shifter 304 includes an input port 320, and output port 322, and first and second terminated ports 324-1 and 324-2.

The output port 312 of the QHC 306 of the first phase shifter 302 is coupled to the input pot 320 of the QHC 316 of the second phase shifter 304. Thus, output from the first phase shifter 302 can be fed as input to the second phase shifter 304. Accordingly, the first phase shifter 302 and the second phase shifter 304 can function in combination to provide variable phase shift between the input port 310 of the QHC 306 of the first phase shifter 302 and the output port 322 of the QHC 316 of the second phase shifter 304.

The first phase shifter 302 includes first static lumped elements 326-1 and second static lumped elements 326-2 (herein referred to as "static lumped elements 326"). The static lumped elements 326 can either or both reduce a physical size and one or more electrical dimensions of the QHC 306 of the first phase shifter 302. Additionally, the first phase shifter 302 includes first variable lumped elements 328-1 and second variable lumped elements 328-2 (herein referred to as "variable lumped elements 328"). The variable lumped elements 328 can be used to control a variable phase shift applied to input signals by the first phase shifter 302.

The second phase shifter 304 includes first static lumped elements 330-1 and second static lumped elements 330-2 (herein referred to as "static lumped elements 330"). The static lumped elements 330 can either or both reduce a physical size and one or more electrical dimensions of the QHC 316 of the second phase shifter 304. Additionally, the second phase shifter 304 includes first variable lumped elements 332-1 and second variable lumped elements 332-2 (herein referred to as "variable lumped elements 332"). The variable lumped elements 332 can be used to control a variable phase shift applied to input signals by the second phase shifter 304.

In an example of operation of the example multi-stage phase shifter 300 shown in FIG. 3, the first phase shifter 302 can receive an input signal at the input port 310 of the QHC 306. Bias voltages on the variable lumped elements 328 can be controlled to apply a specific phase shift of a variable phase shift to the input signal to create a phase shifted signal. The phase shifted signal can then be output through the output port 312 of the QHC 306 to the second phase shifter 304 through the input port 320 of the QHC 316 of the second phase shifter 304. Bias voltages on the variable lumped elements 332 can be controlled to apply another specific phase of a variable phase shift amount to the phase shifted signal to create a further phase shifted signal. The further phase shifted signal can then be output through the output port 322 of the QHC 316 of the second phase shifter 304.

While the example multi-stage phase shifter 300 shown in FIG. 3 only includes two phase shifters, in various embodiments, a multi-stage phase shifter 300 can be created with more than two phase shifters coupled in series. For example, a multi-stage phase shifter can include three individual phase shifters coupled in series together through input and output ports of corresponding QHCs of the phase shifters. Further in the example, each individual phase shifter can include corresponding static lumped elements to reduce either or both a physical size and one or more electrical dimensions of the phase shifters. Still further in the example, each individual phase shifter can include corresponding variable lumped elements to control a specific phase shift of a variable phase shift applied to input signals by each of the individual phase shifters.

In various embodiments, the multi-stage phase shifter 300 shown in FIG. 3 has the same or comparable performance characteristics as currently available commercial phase shifters, e.g. an Analog Devices® HMC1133LP5E GaAs 6-bit digital phase shifter. Specifically, the multi-stage phase shifter 300 shown in FIG. 3 can have a footprint of 7 mm by 7 mm when implemented on a printed circuit board, e.g. the transmission lines 308 and 318 are printed as microstrips onto the printed circuit board. By comparison, the HMC1133LP5E GaAs 6-bit digital phase shifter can have a footprint of 5 mm by 5 mm. Further, the multi-stage phase shifter 300 can have the same tuning range of variable phase shift on signals in the 5.8 GHz to 5.9 GHz frequency range as currently available commercial phase shifters. For example, the multi-stage phase shifter 300 can have a same 360° variable phase shift tuning range on signals in the 5.8 GHz to 5.9 GHz frequency range as the HMC1133LP5E GaAs 6-bit digital phase shifter. Additionally, the multi-stage phase shifter 300 can have the same or a comparable insertion loss of currently available commercial phase shifters. For example, the multi-stage phase shifter 300 can have an insertion loss of around 5 dB+/−0.5 dB.

In various embodiments, the multi-stage phase shifter 300 shown in FIG. 3 can be controlled using analog control signals, thereby decreasing costs associated with fabricating and maintaining systems incorporating the multi-stage phase shifter 300. This is advantageous over currently available commercial phase shifters, such as the HMC1133LP5E GaAs 6-bit digital phase shifter, which can only be controlled using digital control signals and systems. Further, in various embodiments, the multi-stage phase shifter 300 shown in FIG. 3 can be fabricated cheaper than costs of currently available commercial phase shifters. For example, the multi-stage phase shifter 300 shown in FIG. 3 can be fabricated at a cost between $1 and $4 as opposed to the HMC1133LP5E GaAs 6-bit digital phase shifter which costs between $80 and $100 per phase shifter.

Figure 4A:
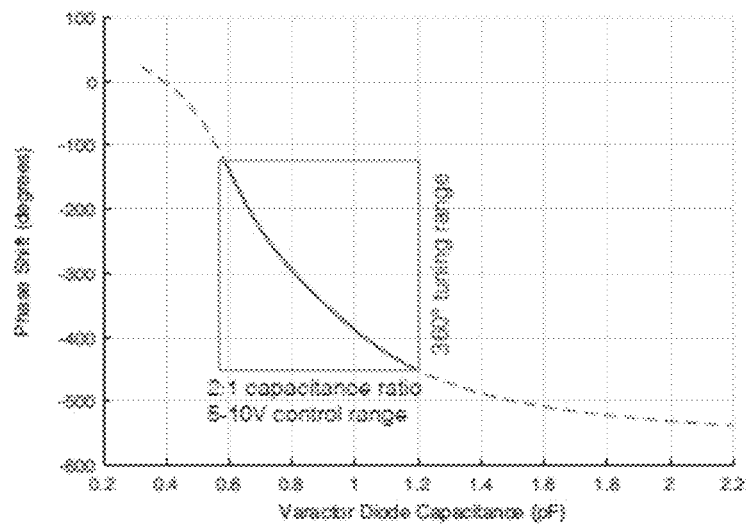
FIG. 4A depicts a phase shift performance graph of an amount of phase shift achieved by a multi-stage phase shifter as a function of capacitance of variable lumped elements.

FIG. 4A depicts a phase shift performance graph 400 of an amount of phase shift achieved by a multi-stage phase shifter as a function of capacitance of variable lumped elements. More specifically, the performance graph 400 shows an amount of phase shift achieved as a function of capacitance of varactor diodes included as part of the multi-stage phase shifter. The performance of the multi-stage phase shifter shown in FIG. 4A can include performance of an applicable multi-stage phase shifter including variable lumped elements, such as the multi-stage phase shifter shown in FIG. 3. Specifically, FIG. 4A shows phase shifting performance of a multi-stage phase shifter implemented with QHCs and static lumped elements used to reduce either or both physical sizes and electrical dimensions of the QHCs.

Bias voltages applied to variable lumped elements of a phase shifter, e.g. as part of a multi-stage phase shifter, can be controlled to change capacitance or other reactance levels of the variable lumped elements. With respect to FIG. 4A, a capacitance of varactor diodes included as part of a multi-stage phase shifter, can vary between 0.2 pF and 2.2 pF based on applied biases. In turn, over 500° of variable phase change is observed in the multi-stage phase shifter as the capacitance of the varactor diodes is varied.

In specific embodiments, biases applied to varactor diodes of a multi-stage phase shifter are limited to a range of between 5 V and 10 V. In turn, as shown in FIG. 4A, capacitances of the varactor diodes of the multi-stage phase shifter range between 0.5 pF and 1.2 pF in response to application of bias voltages in the range of 5 V to 10 V. Further, within this capacitance range, 360° of tuning range of a variable phase shift is achieved in the multi-stage phase shifter.

Figure 4B:
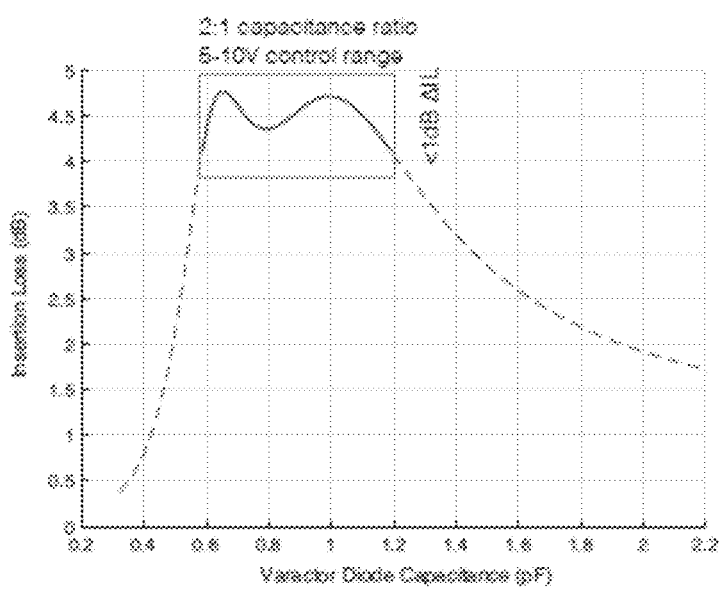
FIG. 4B depicts another phase shift performance graph of an amount of insertion loss observed in a multi-stage phase shifter as a function of capacitance of variable lumped elements.

FIG. 4B depicts another phase shift performance graph 402 of an amount of insertion loss observed in a multi-stage phase shifter as a function of capacitance of variable lumped elements. More specifically, the performance graph 402 shows an observed insertion loss in the phase shifter as a function of capacitance of varactor diodes included as part of the multi-stage phase shifter. The performance of the multi-stage phase shifter shown in FIG. 4B can include performance of an applicable multi-stage phase shifter including variable lumped elements, such as the multi-stage phase shifter shown in FIG. 3. Specifically, FIG. 4B shows phase shifting performance of a multi-stage phase shifter implemented with QHCs and static lumped elements used to reduce either or both physical sizes and electrical dimensions of the QHCs.

As discussed previously, bias voltages applied to variable lumped elements of a phase shifter, e.g. as part of a multi-stage phase shifter, can be controlled to change capacitance or other reactance levels of the variable lumped elements.

Further, as discussed previously, in specific embodiments, biases applied to varactor diodes of a multi-stage phase shifter are limited to a range of between 5 V and 10 V. In turn, as shown in FIG. 4B, capacitances of the varactor diodes of the multi-stage phase shifter range between 0.5 pF and 1.2 pF in response to application of bias voltages in the range of 5 V to 10 V. Further, within this capacitance range a varying insertion loss of between 4 dB and 5 dB is observed. More specifically within this capacitance range, an average insertion loss of 4.5 dB+/−0.5 dB is observed. As discussed previously, this is comparable to currently available commercial phase shifters.

Figure 5:
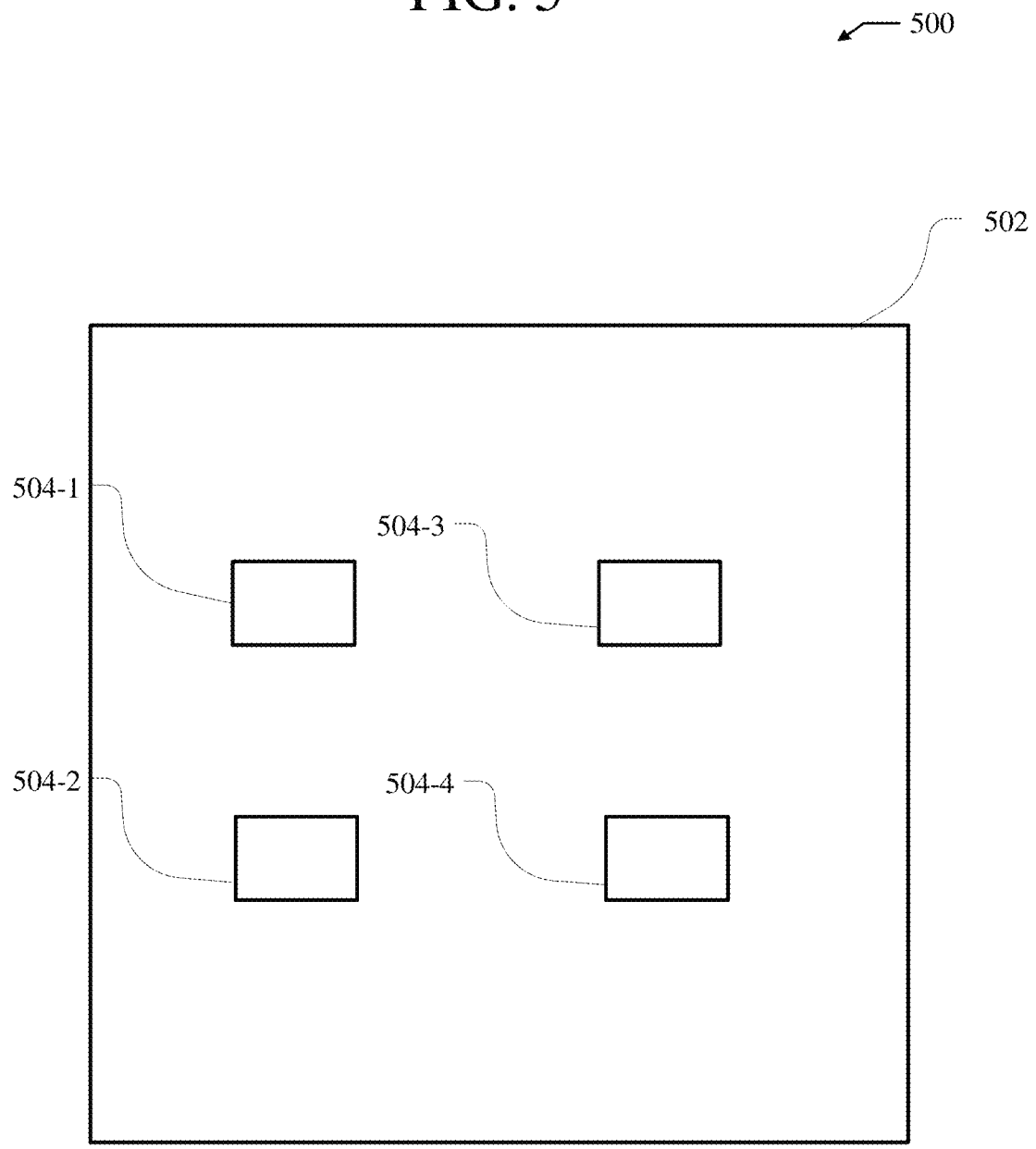
FIG. 5 depicts a diagram of an array of phase shifters.

FIG. 5 depicts a diagram of an array of phase shifters 500. The array of phase shifters 500 includes a printed circuit board 502. Additionally, the array of phase shifters 500 includes a first phase shifter 504-1, a second phase shifter 504-2, a third phase shifter 504-3, and a fourth phase shifter 504-4 (herein referred to as "phase shifters 504"). The phase shifters 504 are disposed on the printed circuit board 502. In being disposed on the printed circuit board 502, one or more of the phase shifters and/or components of the phase shifters can be printed on the printed circuit board 502. For example, the first phase shifter 504-1 can include a QHC formed by transmission lines printed on the printed circuit board 502. Additionally, in being disposed on the printed circuit board 502, one or more of the phase shifters and/or components of the phase shifters can be mounted to the printed circuit board 502. For example, the second phase shifter 504-2 can include capacitors that are mounted on the printed circuit board 502.

Any one of the phase shifters 504 can include a QHC and either or both variable lumped elements and static lumped elements, such as the phase shifters shown in FIGS. 1 and 2. In including static lumped elements, a QHC of any of the phase shifters 504 can have either or both a reduced physical size and reduced electrical dimensions. Additionally, any one of the phase shifters 504 can be multi-stage phase shifters, such as the multi-stage phase shifter shown in FIG. 3. For example, the second phase shifter 504-2 can include a plurality of QHCs, static lumped elements, and variable lumped elements forming individual phase shifters. Further in the example, the individual phase shifters can be connected, e.g. in series, to provide at least 360° of variable phase shift as part of a multi-stage phase shifter.

Figure 6:
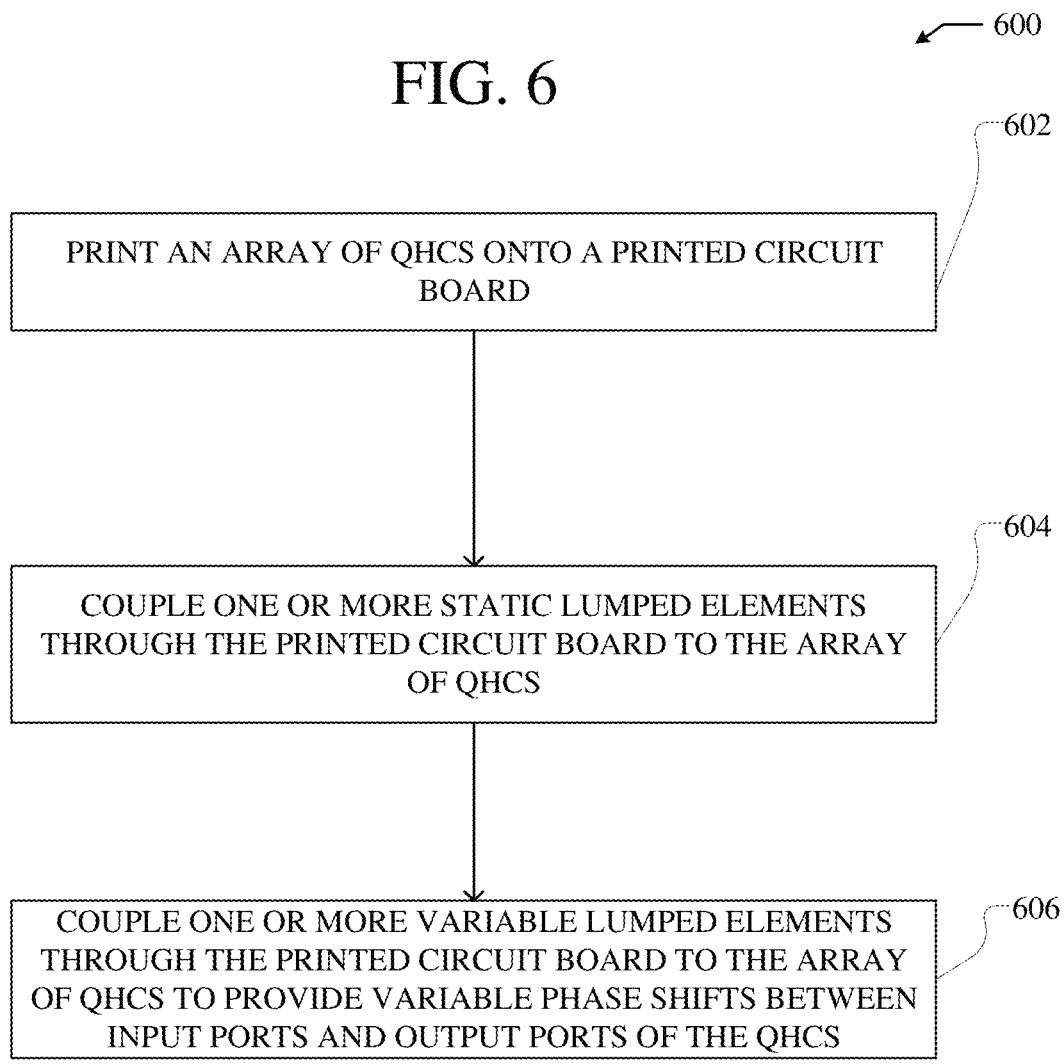
FIG. 6 is a flowchart of an example method of fabricating an array of phase shifters for use in applying phase shifts of variable phase shifts to signals.

FIG. 6 is a flowchart 600 of an example method of fabricating an array of phase shifters for use in applying phase shifts of variable phase shifts to signals. At step 602, an array of QHCs is printed onto a printed circuit board. The array of QHCs can be printed onto the printed circuit board by printing an array of transmission line microstrips onto the printed circuit board. Each QHC of the array of QHCs can have an input port, an output port, and two terminated ports. The arrays of QHCs can form, at least in part, an array of phase shifters. Additionally, input ports and output ports of the QHCs in the array of QHCs can be connected to form multi-stage phase shifters. For example, an output port of a first QHC of the array of QHCs can be coupled to an input port of a second QHC of the array of QHCs to form a multi-stage phase shifter, such as the multi-stage phase shifter shown in FIG. 3.

At step 604, one or more static lumped elements are coupled to the array of QHCs through the printed circuit board. In coupling the one or more static lumped elements to the array of QHCs through the printed circuit board, the one or more static lumped elements can either be printed on the printed circuit board or mounted to the printed circuit board. The one or more static lumped elements can function to reduce either or both physical sizes and electrical dimensions of the QHCs in the array of QHCs. For example, the one or more static lumped elements can reduce electrical dimensions of the QHCs in the array to substantially less than a quarter wavelength.

Accordingly, the array of QHCs can be printed on the printed circuit board according to the one or more static lumped elements. More specifically, the array of QHCs can be printed on the printed circuit board according to characteristics of the one or more static lumped elements and/or operational characteristics of the one or more static lumped elements. For example, the array of QHCs can be printed on the printed circuit board according to capacitances of the one or more lumped elements.

At step 606, one or more variable lumped elements are coupled to the array of QHCs through the printed circuit board. In coupling the one or more variable lumped elements to the array of QHCs through the printed circuit board, the one or more variable lumped elements can either be printed on the printed circuit board or mounted to the printed circuit board. For example one or more varactor diodes can be printed onto the printed circuit board, potentially when the array of QHCs are printed on the printed circuit board. The one or more variable lumped elements function to provide variable phase shifts between the input ports and the output ports of the QHCs to form an array of phase shifters. More specifically, the one or more variable lumped elements can be controlled to apply specific phase shifts of variable phase shifts between the input ports and the output ports of the QHCs. For example, bias voltages can be applied to the one or more variable lumped elements to achieve desired capacitances in the variable lumped elements. Further in the example, the desired capacitances in the variable lumped elements correspond to desired applied phase shifts across the input and output ports of the QHCs.

Figure 7:
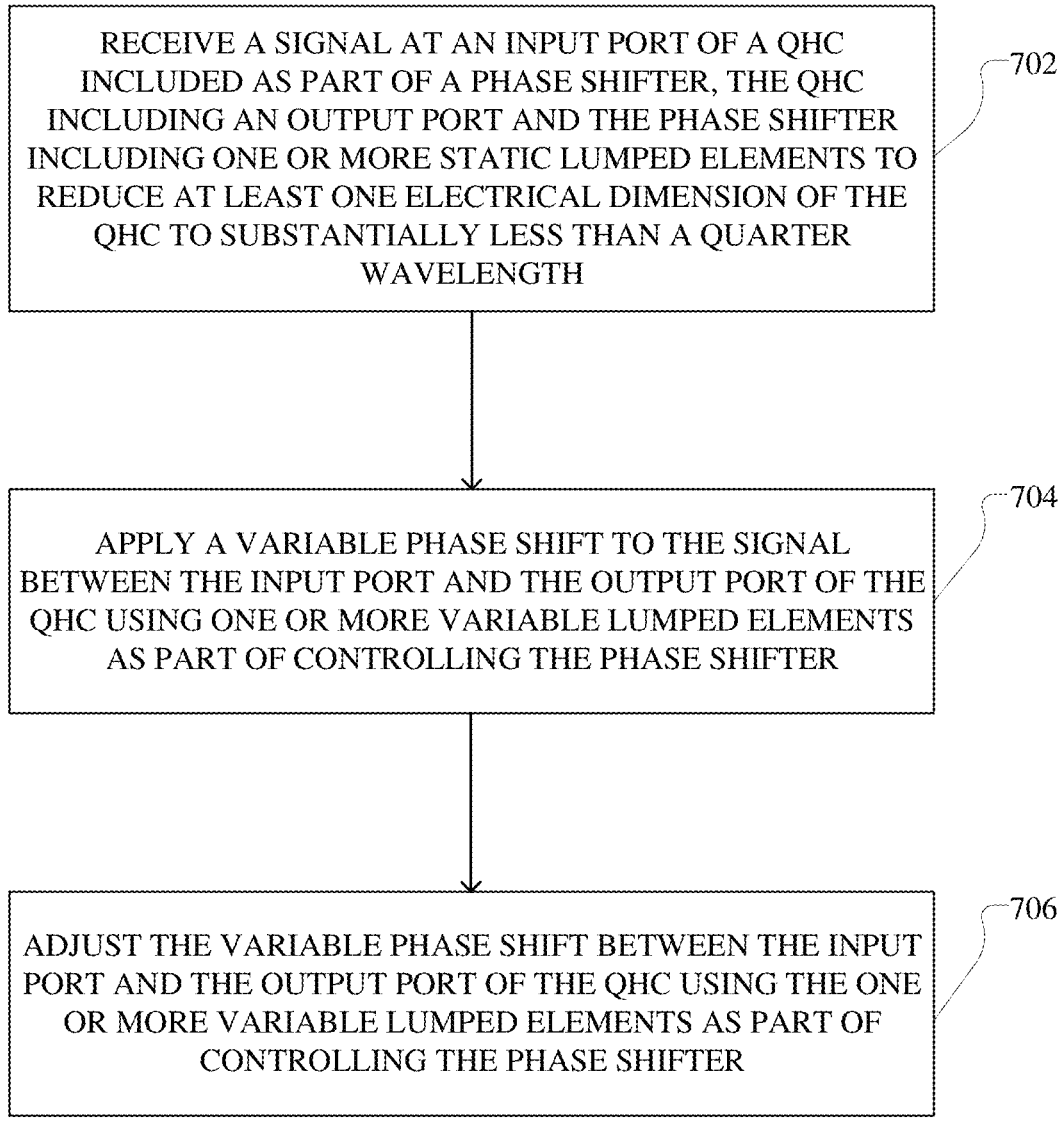
FIG. 7 is a flowchart of an example method of applying a variable phase shift of a phase shifter including a quadrature hybrid coupler with reduced electrical dimensions.

FIG. 7 is a flowchart 700 of an example method of applying a variable phase shift of a phase shifter including a QHC with reduced electrical dimensions. At step 702, a signal is received at an input port of a QHC included as part of a phase shifter. The QHC includes an output port and the phase shifter includes one or more static lumped elements to reduce at least one electrical dimension of the QHC to substantially less than a quarter wavelength.

At step 704, a variable phase shift is applied to the signal between the input port and the output port of the QHC using one or more variable lumped elements in the phase shifter as part of controlling the phase shifter. More specifically, bias voltages can be applied to the one or more variable lumped elements to achieve a desired phase shift amount of the variable phase shift between the input port and the output port of the QHC. Subsequently, the desired phase shift amount of the variable phase shift can be applied to the signal as it is transmitted between the input port and the output port of the QHC.

At step 706, the variable phase shift between the input port and the output port of the QHC is adjusted using the one or more variable lumped elements as part of controlling the phase shifter. More specifically, the bias voltages applied to the one or more variable lumped elements can be adjusted to change an applied phase shift amount of the variable phase shift between the input port and the output port of the QHC. For example, the bias voltages applied to the one or more variable lumped elements can be modified to change capacitances of the one or more variable lumped elements. Further in the example, the capacitances of the one or more variable lumped elements correspond to a changed phase shift of the variable phase shift applied between the input port and the output port of the QHC.

Figure 8:
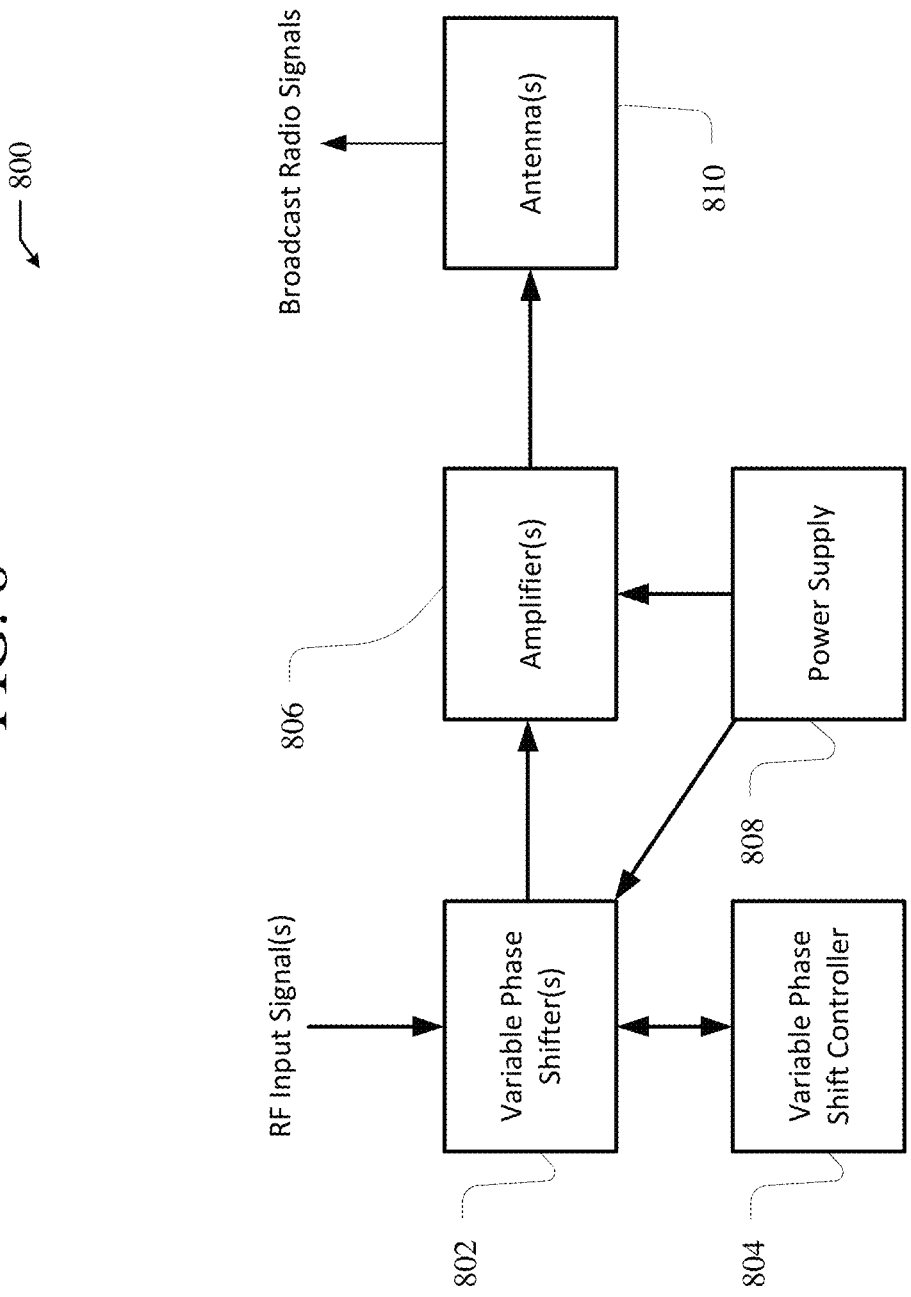
FIG. 8 depicts a diagram of an example radio frequency transmitter system.

FIG. 8 depicts a diagram of an example radio frequency (herein referred to as "RF") transmitter system 800. The example RF transmitter system 800 shown in FIG. 8 includes variable phase shifters 802, a variable phase shift controller 804, amplifiers 806, a power supply 808, and antennas 810. The variable phase shifters 802 include one or a plurality of phase shifters, e.g. an array of phase shifters. Additionally, the variable phase shifters 802 can include any of the phase shifters described herein, e.g. the multi-stage phase shifter shown in FIG. 3. Specifically, the variable phase shifters 802 can include QHCs and one or more static lumped elements configured to reduce one or more electrical dimensions of the QHCs by substantially less than a quarter wavelength. The variable phase shifters 802 can also include one or more variable lumped elements configured to control a specific phase shift of a variable phase shift applied by the variable phase shifters 802.

In the example RF transmitter system shown in FIG. 8, the variable phase shifters 802 receive RF input signal(s). Subsequently the variable phase shifters 802 can apply specific phase shifts of variable phase shifts to the received input signals to generate phase shifted RF input signals. More specifically, the variable phase shifters 802 can apply phase shifts of variable phase shifts to the received input signals across a tuning range of 0° to 360°.

The variable phase shifters 802 can apply specific phase shifts of variable phase shifts using control signals received from the variable phase shift controller 804. The variable phase shift controller 804 can apply analog control signals to the variable phase shifters 802 to control the variable phase shifters. More specifically, the variable phase shift controller 804 can bias one or more variable lumped elements of the variable phase shifters 802 to cause the variable phase shifters 802 to apply specific phase shifts of variable phase shifts to the received RF input signals. Analog control signals applied by the variable phase shift controller 804 can be generated from digital control signals converted to analog control signals through an analog to digital converter, e.g. an A/D converter included as part of the variable phase shift controller 804.

The variable phase shift controller 804 can control the variable phase shifters 802 based on a desired phase to broadcast RF signals at using the RF input signals. More specifically, the variable phase shift controller 804 can control the variable phase shifters 802 to steer a beam of RF energy broadcasted using the RF input signals phase shifted by the variable phase shifter 802. For example, the variable phase shift controller 804 can control the variable phase shifters 802 to cause a beam of RF energy broadcasted using phase shifted RF input to move 45° in space.

In various embodiments, the variable phase shift controller 804 can control the variable phase shifters 802 based on positions of one or more RF transceivers that receive RF signals broadcast using the phase shifted RF input signals. More specifically, the variable phase shift controller 804 can control the variable phase shifters 802 to cause broadcasting of a beam of RF energy towards one or more RF transceivers. For example, the variable phase shift controller 804 can control the variable phase shifters 802 to steer a beam of RF energy towards a drone as the drone moves in space.

The variable phase shifters 802 can provide the phase shifted RF input signals to the amplifiers 806. The amplifiers 806 can include a single amplifier or a plurality of amplifiers, e.g. as part of an array of amplifiers. The amplifiers 806 increase the power of the phase shifted RF input signals. In various embodiments, the amplifiers 806 include a plurality of amplifiers that the phase shifted RF input signals pass through as part of amplifying the phase shifted RF input signals in multiple stages. For example, the amplifiers 806 can include a middle stage power amplifier configured to amplify the phase shifted RF input signals to a middle power level and a high stage power amplifier configured to amplify the phase shifted RF input signals to a high power level after they are amplified to the middle power level.

The amplified signals can be provided from the amplifiers 806 to the antennas 810, where the amplified signals are broadcasted as radio signals. In various embodiments, the antennas can be integrated on the same printed circuit board where one or a combination of the variable phase shifter 802, the variable phase shift controller 804, the amplifiers 806 are implemented.

Figure 9:
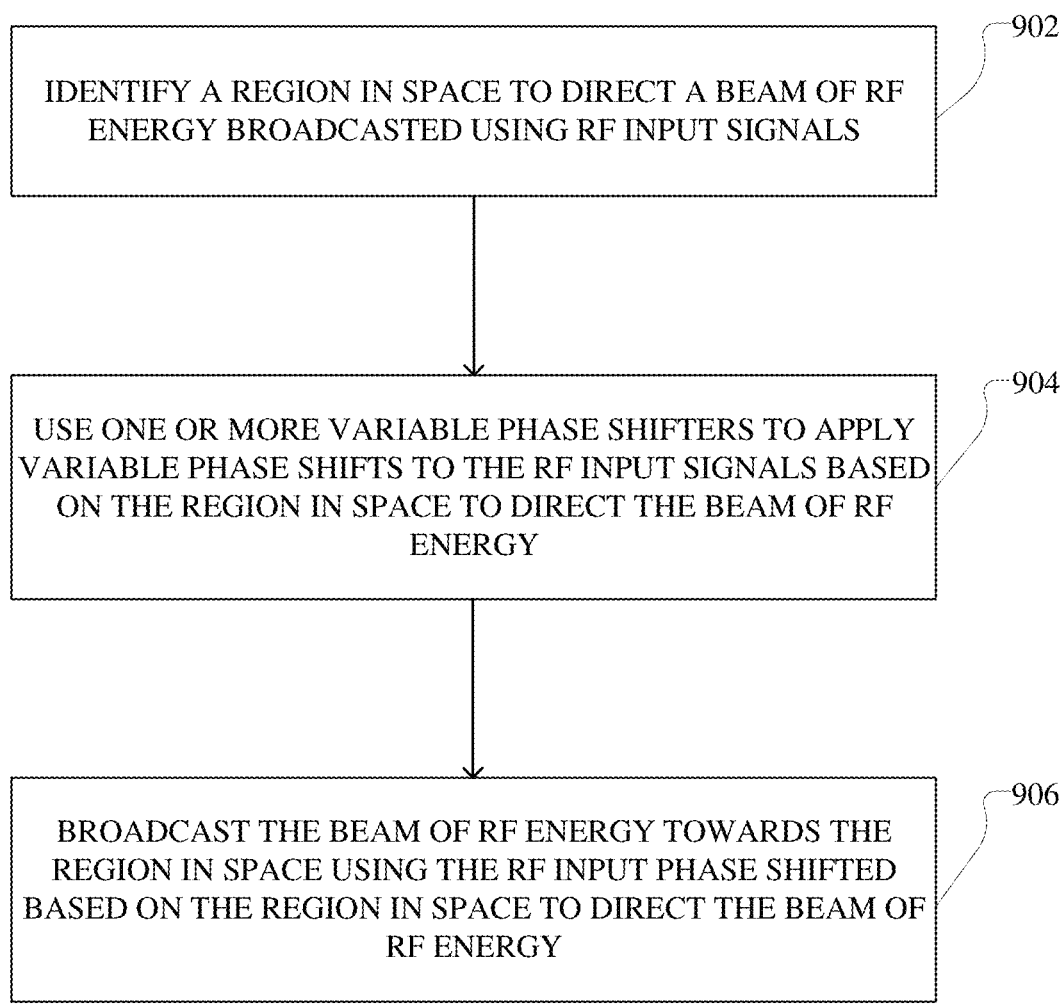
FIG. 9 is a flowchart of an example method of controlling a variable phase shifter.

FIG. 9 is a flowchart 900 of an example method of controlling a variable phase shifter. The method shown in FIG. 9 can be used to control any of the phase shifters described herein. Additionally, the method shown in FIG. 9 can be used to control individual variable phase shifters in an array of variable phase shifters, potentially simultaneously.

At step 902, a region in space to direct a beam of RF energy broadcasted using RF input signals is identified. The region of space to direct the beam of RF energy can be identified based on user input. For example, a user can specify to direct the beam of RF energy to specific coordinates in space. Additionally, the region of space to direct the beam of RF energy can be determined based on a position of an RF receiver. More specifically, the region of space to direct the beam of RF energy can correspond to regions of space that the RF receiver moves to as the RF receiver moves in the space.

At step 904, one or more variable phase shifters are used to adjust phases of the RF input signals based on the region in space to direct the RF energy. Additionally, the phases of the RF input signals can be adjusted based on initial phases of the RF input signals to direct the beam of RF energy to the region in space. The variable phase shifters can include any one of the phase shifters described herein. For example, the phase shifters can include the multi-stage phase shifter shown in FIG. 3. In another example, the one or more phase shifters can include a single phase shifter, such as the phase shifters shown in FIGS. 1 and 2.

At step 906, the beam of RF energy is broadcast towards the region in space using the RF input phase shifted according to the region of space. The beam of RF energy can be broadcast by one or more antennas using the phase shifted RF input. For example, an array of antennas can act as a phased array by broadcasting the beam of RF energy using the phase shifted RF input. In broadcasting the RF energy towards the region in space using the phase shifted RF input, the beam of RF energy can be directed towards a region of space that a receiver occupies or will occupy, e.g. the region of space that the receiver will occupy when the beam of RF energy is in the region of space.

The example phase shifters, controllers, and systems shown herein can be configured or included as part of systems configured to wirelessly transfer power using RF signals. Specifically, the phase shifters can be used to shift phases of RF signals for wirelessly transferring power using the RF signals. Additionally, the phase shifters can be used for wirelessly transferring power through a steerable beam of RF energy. For example, the phase shifters can be used to shift a phase of RF signals to steer a beam of RF energy transmitted through antennas forming a phased array to wirelessly transfer power through a steerable beam.

In certain embodiments, the phase shifters described herein can be controlled by the control systems described herein based on a position of a wireless power receiver. More specifically, the phase shifters can be controlled to cause steering of a RF signals used to wireless transfer power towards a wireless power receiver. For example, a beam of RF energy used to transfer power wirelessly to a wireless power receiver can be steered based on a changing position of the receiver in order to constantly transfer power wirelessly to the wireless power receiver. Further in the example, the beam of RF energy can be steered by phase shifting RF input signals used to create the beam of RF energy, e.g. based on the changing position of the receiver.

This disclosure has been made with reference to various exemplary embodiments including the best mode. However, those skilled in the art will recognize that changes and modifications may be made to the exemplary embodiments without departing from the scope of the present disclosure. For example, various operational steps, as well as components for carrying out operational steps, may be implemented in alternate ways depending upon the particular application or in consideration of any number of cost functions associated with the operation of the system, e.g., one or more of the steps may be deleted, modified, or combined with other steps.

While the principles of this disclosure have been shown in various embodiments, many modifications of structure, arrangements, proportions, elements, materials, and components, which are particularly adapted for a specific environment and operating requirements, may be used without departing from the principles and scope of this disclosure. These and other changes or modifications are intended to be included within the scope of the present disclosure.

The foregoing specification has been described with reference to various embodiments. However, one of ordinary skill in the art will appreciate that various modifications and changes can be made without departing from the scope of the present disclosure. Accordingly, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, a required, or an essential feature or element. As used herein, the terms "comprises," "comprising," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A phase shifter, comprising:
a quadrature hybrid coupler (QHC) that includes an input port, an output port, and two terminated ports;
one or more static lumped elements connected to the QHC, wherein an inclusion of the one or more static lumped elements with the QHC sets at least one electrical dimension of the QHC at substantially less than a quarter wavelength of an operating frequency of the QHC; and
one or more variable lumped elements connected to the QHC and configured to provide a variable phase shift between the input port and the output port.

2. The phase shifter of claim 1, wherein the one or more variable lumped elements include one or more variable reactance devices or materials.

3. The phase shifter of claim 2, wherein the one or more variable reactance devices are variable responsive to control inputs.

4. The phase shifter of claim 2, wherein the one or more variable lumped elements include one or more varactor diodes.

5. The phase shifter of claim 4, wherein the variable phase shift between the input port and the output port is adjusted by controlling biases applied to the one or more varactor diodes to adjust capacitances of the one or more varactor diodes.

6. The phase shifter of claim 1, wherein the one or more static lumped elements include one or more static shunt capacitors.

7. The phase shifter of claim 1, wherein the variable phase shift has a tuning range between 90° to 180°.

8. The phase shifter of claim 1, wherein the QHC has a footprint less than or equal to one tenth of an operating wavelength of the operating frequency of the QHC by one tenth of the operating wavelength of the operating frequency of the QHC.

9. The phase shifter of claim 8, wherein the operating frequency of the QHC is between 5.8 GHz and 5.9 GHz.

10. The phase shifter of claim 8, wherein the operating frequency of the QHC is between 24 GHz and 24.5 GHz.

11. The phase shifter of claim 8, wherein the operating frequency of the QHC is a frequency band within a frequency range of greater than 0 GHz and less than or equal to 24.5 GHz.

12. The phase shifter of claim 8, wherein the QHC has a footprint less than or equal to 3 millimeters by 3 millimeters.

13. The phase shifter of claim 1, wherein the QHC includes a first transmission line, a second transmission line, a third transmission line, and a fourth transmission line, the first and third transmission lines having electrical lengths less than or equal to one eighth wavelength and the second and fourth transmission lines having electrical lengths less than or equal to one sixteenth wavelength.

14. The phase shifter of claim 13, wherein the first, second, third, and fourth transmission lines are printed as microstrips in a printed circuit board and at least one of the one or more static lumped elements and the one or more variable lumped elements are mounted onto the printed circuit board.

15. The phase shifter of claim 1, wherein the one or more static lumped elements include one or more lumped inductors.

16. The phase shifter of claim 1, wherein the phase shifter is configured to control the variable phase shift using an analog control signal.

17. The phase shifter of claim 16, wherein the analog control signal is converted from a digital control signal.

18. The phase shifter of claim 1, wherein the variable phase shift is applied to an RF signal used to wirelessly transmit radio waves for wirelessly transferring power.

19. A method comprising:
receiving a signal at an input port of a quadrature hybrid coupler (QHC) included as part of a phase shifter, the QHC including an output port, and two terminated ports, the phase shifter including:
one or more static lumped elements connected to the QHC, wherein an inclusion of the one or more static lumped elements with the QHC sets at least one electrical dimension of the QHC at substantially less than a quarter wavelength of a frequency of the signal; and
one or more variable lumped elements connected to the QHC and configured to provide a variable phase shift to signals including the signal between the input port and the output port; and
adjusting the variable phase shift between the input port and the output port using the one or more variable lumped elements as part of controlling the phase shifter.

20. The method of claim 19, wherein the one or more variable lumped elements include one or more variable reactance devices or materials.

21. The method of claim 20, wherein the one or more variable reactance devices are variable responsive to control inputs.

22. The method of claim 20, wherein the one or more variable lumped elements include one or more varactor diodes.

23. The method of claim 22, wherein the variable phase shift between the input port and the output port is adjusted by controlling biases applied to the one or more varactor diodes to adjust capacitances of the one or more varactor diodes.

24. The method of claim 19, wherein the one or more static lumped elements include one or more static shunt capacitors.

25. The method of claim 19, wherein the variable phase shift is applied to an RF signal used to wirelessly transmit radio waves for wirelessly transferring power.

26. A system comprising:
an array of phase shifters comprising a plurality of quadrature hybrid couplers (QHCs) that each include an input port, an output port, and two terminated ports, one or more static lumped elements connected to the QHCs, and one or more variable lumped elements connected to the QHCs and configured to provide variable phase shifts between the input ports and the output ports, wherein an inclusion of the one or more static lumped elements with each of the QHCs sets at least one electrical dimension of each of the QHCs at substantially less than a quarter wavelength of an operating frequency of the QHC; and
a controller for controlling the array of phase shifters by controlling the variable phase shifts of the array of phase shifters.

27. The system of claim 26, wherein the one or more variable lumped elements include one or more variable reactance devices or materials.

28. The system of claim 27, wherein the one or more variable reactance devices are variable responsive to control inputs.

29. The system of claim 27, wherein the one or more variable lumped elements include one or more varactor diodes.

30. The system of claim 29, wherein the variable phase shifts between the input port and the output port are adjusted by controlling biases applied to the one or more varactor diodes to adjust capacitances of the one or more varactor diodes.

31. The system of claim 26, wherein the static lumped elements include one or more static shunt capacitors.

32. The system of claim 26, wherein at least one of the QHCs of the array of phase shifters include a first transmission line, a second transmission line, a third transmission line, and a fourth transmission line, the first and third transmission lines having electrical lengths less than or equal to one eighth wavelength and the second and fourth transmission lines having electrical lengths less than or equal to one sixteenth wavelength.

33. The system of claim 32, wherein the first, second, third, and fourth transmission lines are printed as microstrips in a printed circuit board and at least one of the one or more static lumped elements and the one or more variable lumped elements are mounted onto the printed circuit board.

34. The system of claim 26, wherein the one or more static lumped elements include one or more lumped inductors.

35. The system of claim 26, wherein the array of phase shifters are configured to control the variable phase shifts according to analog control signals.

36. The system of claim 35, wherein the analog control signals are converted from digital control signals.

37. The system of claim 26, wherein the variable phase shifts are applied to RF signals used to transmit radio waves for wirelessly transferring power and the array of phase shifters are configured to wirelessly transfer the power.

38. The system of claim 26, wherein at least two of the phase shifters in the array of phase shifters are configured to, in combination as a first phase shifting stage and a second phase shifting stage, provide a variable phase shift of the variable phase shifts between the input ports and the output ports.

39. The system of claim 38, wherein the at least two of the phase shifters are configured to provide a tuning range of at least 360° in the variable phase shifts between the input ports and the output ports.

40. The system of claim 39, wherein the at least two of the phase shifters are coupled in series to provide the tuning range of at least 360° in the variable phase shifts between the input ports and the output ports.

41. The system of claim 26, wherein the controller is configured to control the array of phase shifters to adjust the variable phase shifts in order to steer an RF beam formed using RF signals phase shifted by the array of phase shifters.

42. The system of claim 26, further comprising an array of amplifiers coupled to the array of phase shifters, the array of amplifiers configured to amplify signals shifted by the array of phase shifters to create amplified signals.

43. The system of claim 42, further comprising an array of antennas coupled to the array of phase shifters, the array of antennas configured to transmit electromagnetic radiation using the amplified signals.

* * * * *